United States Patent [19]

Vergnolle et al.

[11] 4,216,444
[45] Aug. 5, 1980

[54] STEP ADJUSTABLE ATTENUATOR

[75] Inventors: Claude Vergnolle; Christian Val, both of Paris, France

[73] Assignee: Thomson-CSF, Paris, France

[21] Appl. No.: 942,195

[22] Filed: Sep. 14, 1978

[30] Foreign Application Priority Data

Sep. 16, 1977 [FR] France ................................ 77 28066

[51] Int. Cl.² .............................................. H03H 7/26
[52] U.S. Cl. .................................. 333/81 R; 338/195; 338/288; 338/307
[58] Field of Search ............. 333/81 R, 81 A; 338/49, 338/120, 195, 176, 288, 289, 292, 307–309

[56] References Cited

U.S. PATENT DOCUMENTS

| | | | |
|---|---|---|---|
| 3,344,387 | 9/1967 | Kinkel et al. | 338/308 X |
| 3,489,980 | 1/1970 | Masters | 338/308 |
| 3,599,125 | 8/1971 | Yoshida | 333/81 A |

Primary Examiner—Paul L. Gensler
Attorney, Agent, or Firm—Cushman, Darby & Cushman

[57] ABSTRACT

A step adjustable attenuator comprising a silicon substrate on one face of which are deposited thin film-type resistors and electrical conductors by which the resistors are interconnected. Contact points are arranged at the periphery of the substrate and connected to the resistors. However, the attenuating sections are not interconnected on the substrate. A conductive pattern prepared from a conductive film forms finger-like leads of which inner portions are bonded to the contact points. By its shape, the pattern ensures the interconnections between the sections and forms two rows of outputs, one for the connections on the printed-circuit board on which is implanted the attenuator and the other being associated with displaceable straps enabling attenuation to be adjusted.

11 Claims, 9 Drawing Figures

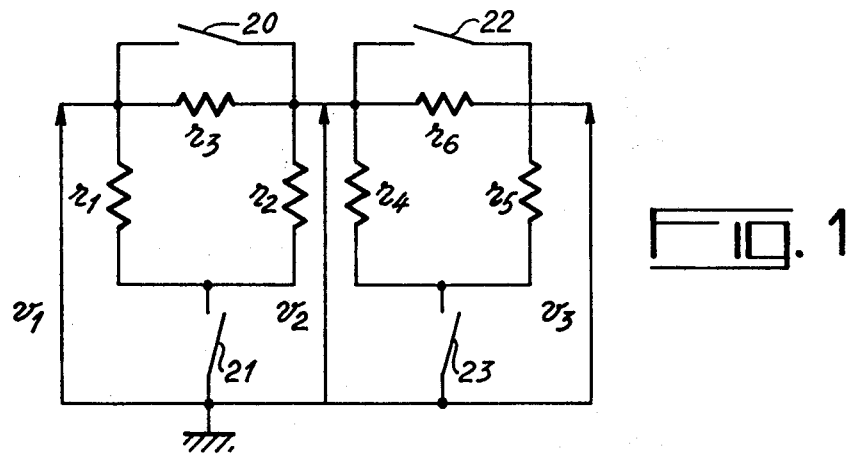
FIG. 1
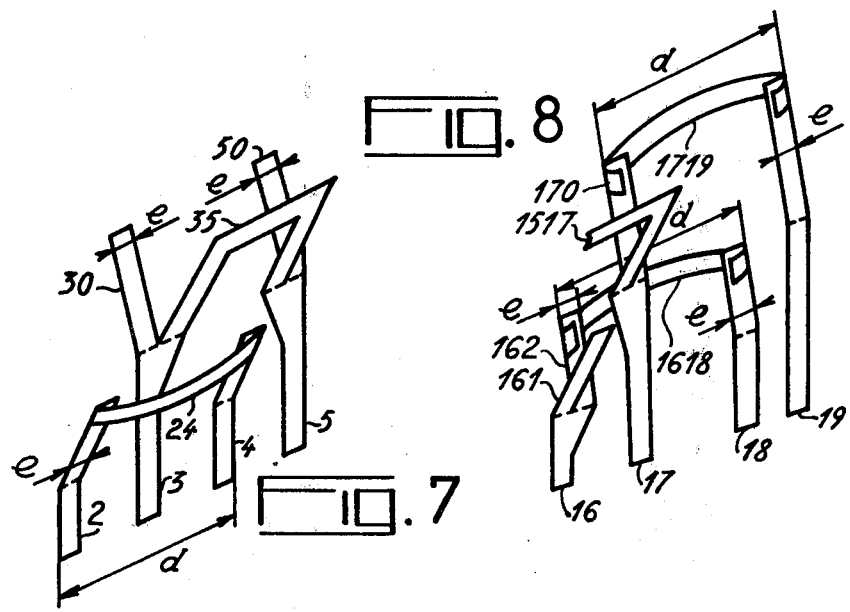
FIG. 8
FIG. 7
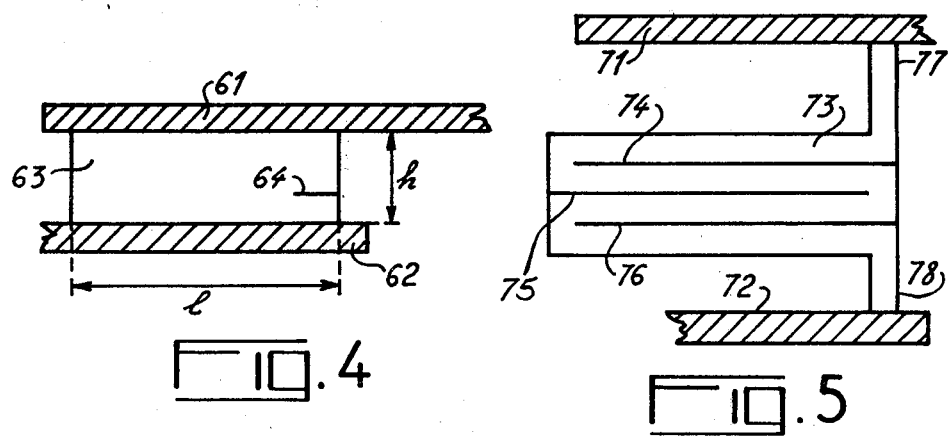
FIG. 4
FIG. 5

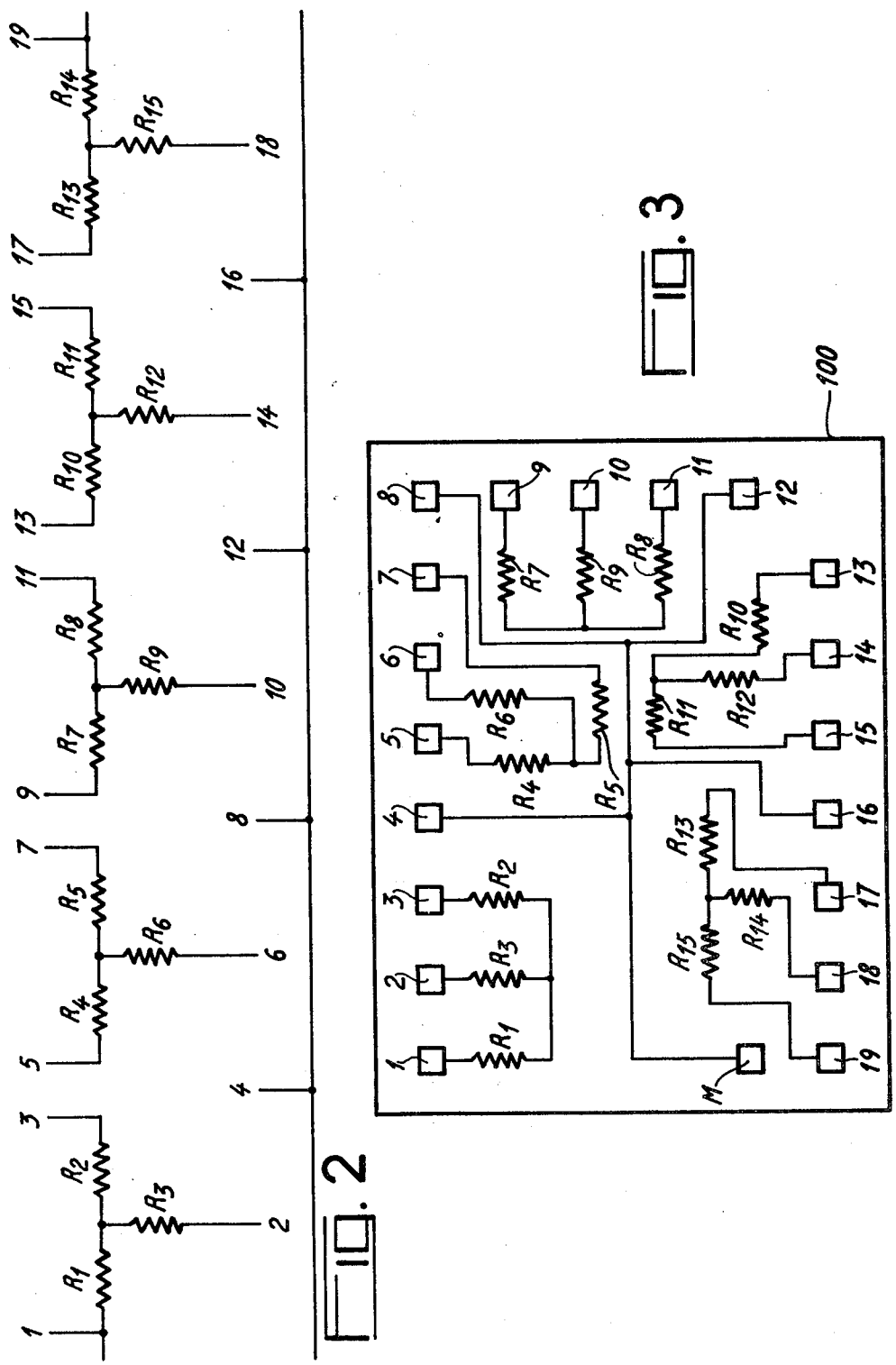

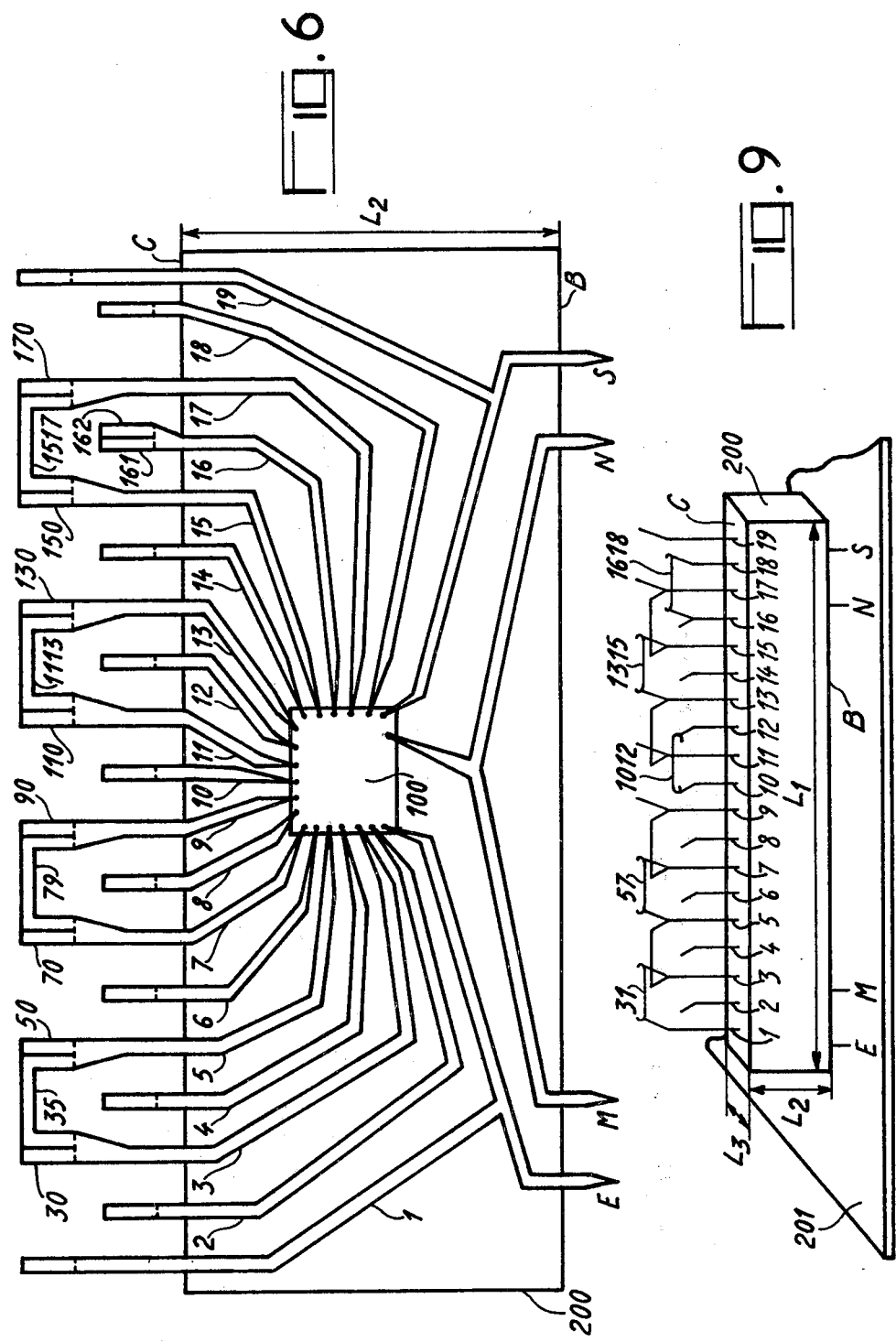

STEP ADJUSTABLE ATTENUATOR

This invention relates to step adjustable attenuators comprising an integrated circuit intended to be implanted on a printed circuit.

The attenuators are generally formed by a chain of T or $\pi$ attenuating sections comprising three resistors. Having two modes of connection, those attenuating sections have two attenuation values: 0 and $\alpha$ db, so that the total attenuation of the attenuator may assume a certain number of discrete values as and when required by the operator.

Known attenuators having deposited layer-type circuitry are generally made with thick conductive films disposed on insulative wafers. The wafer is provided with input and output terminals. Thick-film resistors and the terminals are interconnected by thick-film conductors in $\pi$, T or other configurations. The wafer is generally implanted on a printed circuit provided with straps which make the connections with the other wafers implanted with the printed circuit and the interconnections between the terminals as to obtain the desired attenuation. The obtained device is not very compact because of the thick-film technique and because of the straps placed on the printed circuit. Another method is to use a movable wafer comprising contact contacts which is combined with the resistor-carrier wafer. According to the position of the movable wafer relative to the resistor-carrier wafer, the different values of attenuation can be obtained. This method has several drawbacks: When a great number of attenuating sections is desired, the number of terminals which are to be interconnected is very large and several wafers are to be used because of the complexity of the combination between the two types of wafers. The result is a complicated and non-compact device. Furthermore, it is impossible to use the rapid and inexpensive known technique of fabrication of integrated circuit.

The invention uses the advantages of known techniques concerning integrated circuits. The attenuator according to the invention is in the form of a thin layer and is therefore more compact than a thick layer-type circuit. It is formed by deposition onto a silicon substrate.

An object of the invention is to provide a step adjustable attenuator in the form of an integrated circuit with a double row of outputs, the value of the attenuation being easily determined by an operator at the installation site and this integrated circuit being easily implantable on a printed circuit card.

An object of the invention is to use a conductive pattern produced from a metallized film and mounted on the silicon wafer by automatic film transfer techniques so as to reduce the costs and to increase the speed of production.

A further object of the invention is a particular arrangement of the outputs which is particularly convenient for the operator responsible for adjusting attenuation and makes it possible to reduce the overall dimensions of the integrated circuit on the printed circuit card. This is because the outputs are arranged in two opposite rows, one of which comprises all the outputs corresponding to connections intended to be established by means of simple straps by the operator, the other row comprising the outputs for connection with the printed circuit.

Another object of the invention is a mode of implantation of the attenuator on a printed circuit card, in which the side comprising the second row of outputs faces the card, the other side being readily accessible to the operator.

Still another object of the invention is an arrangement of the resistors on the silicon and an order of the outputs which minimise the overall dimensions, avoid any intersection of the conductive deposits on the silicon and make the adjustment of attenuation as easy as possible by means of straps all identical with one another which will be welded after adjustment, thus providing for good electrical contact.

Other features and advantages of the invention will become apparent from the following description in conjunction with the accompanying drawings, wherein:

FIG. 1 is an electrical circuit diagram of an attenuator formed by 2 $\pi$-shaped sections.

FIG. 2 is an electrical circuit diagram of an attenuator formed by 5 T-shaped sections.

FIG. 3 is a block diagram showing the implantation of resistors on a substrate.

FIGS. 4 and 5 show two examples of the geometry of the resistors.

FIG. 6 is a plan view of the wafer carrying the attenuator.

FIGS. 7 and 8 are two detailed views of certain outputs of the cutting.

FIG. 9 is a view of the implantation of the attenuator on a printed-circuit.

Numerous electronic systems, particularly telephone channel circuits, comprise attenuators formed by a chain attenuating sections comprising resistors and having a T-shaped or $\pi$-shaped structure. In the case of application to telephony for example, it is desirable to be able to adjust the attenuation of the attenuator at the installation sites, i.e. after production of the circuit. FIG. 1 is an electrical circuit diagram of an attenuator formed by two $\pi$-shaped sections each comprising three resistors: $r_1$, $r_2$ and $r_3$ for the first and $r_4$, $r_5$ and $r_6$ for the second. When it is closed, a switch 21 enables the resistors $r_1$ and $r_2$ to be connected to earth. When it is closed, a switch 20 enables the resistor $r_3$ to be short-circuited. There are two principal modes of operation:

21 open, 20 closed: the output voltage $V_2$ is equal to the input voltage $V_1$ and the transmission factor $a_1 = V_1/V_2$ of the section is equal to 1.

21 closed, 20 open: the factor $a_1$ depends or $r_1$, $r_2$, $r_3$ and upon the matching conditions. If the section is matched at the input and at the output, $r_c$ being its characteristic resistance, and if $r_1=r_2$, then $$a_1 = y_1 + 1 + Y_1(Y_1+2)$$

where $y_1 = r_3/r_1 = r_3/r_2$ and $r_c = r_1 \sqrt{y_1+2/y_1}$.

The second section of which the input voltage is $V_2$ and the output voltage $V_3$, operates in the same way with two switches 22 and 23. If $r_c$ is its characteristic resistance, its attenuation $a_2$ may assume two values: 1 or $y_2 = 1 \sqrt{y_2(y_2+2)}$ where $y_2 = r_6/r_4 = r_6/r_5$. The total attenuation of the attenuator: $a = a_1 a_2$ may therefore assume 4 discrete values. More generally, an attenuator comprising n sections contains 2 n switches and its attenuation may assume at the most $2^n$ discrete values which may be graduated for example with a scale of 0.5 dB.

The operation of the T sections is similar to that of the $\pi$ sections. FIG. 2 is an electrical circuit diagram of an attenuator formed by 5 T sections. They are respectively formed by groups of resistors ($R_1$, $R_2$, $R_3$), ($R_4$, $R_5$, $R_6$), ($R_7$, $R_8$, $R_9$), ($R_{10}$, $R_{11}$, $R_{12}$), ($R_{13}$, $R_{14}$, $R_{15}$) and have attenuations of, respectively, $A_1$, $A_2$, ... $A_5$.

The attenuator is intended to be formed by thin layer techniques on a silicon substrate. It is desired to minimize the production costs and overall dimensions and, hence, the number of outputs. It is therefore preferable to avoid the intersections between the zones where the resistors and the metallic connections are deposited and of course between the metallic connections themselves. This means that the cells are not interconnected to one another inside the circuit. Thus, refering to FIG. 2, the points 3, 7, 11, 15 corresponding to the outputs of the first four sections are not connected respectively to the points 5, 9, 13, 17 corresponding to the inputs of the last four sections. The points 1 and 19 respectively corresponding to the input and to the output of the attenuator also have to be connected to the electronic circuit in which the component is to be inserted. It can also be seen on FIG. 2 that four points corresponding to the earth of the circuit are provided, namely 4, 8, 12, 16, which the operator responsible for adjustment will be able to connect to the points 2, 6, 10, 14, 18 which are the ends of the resistors $R_3$, $R_6$, $R_9$, $R_{12}$, $R_{15}$.

FIG. 3 is a block diagram showing the implantation of the resistors deposited onto a silicon substrate 100. The various points 1 to 19 of FIG. 2 are materialized by studs having the same references. Implantation complies with the following requirements: the ends of the resistors are connected by film-type metallic conductors to the output contact studs numbered 1, 2, 3, 5, 6, 7, 9, 10, 11, 13, 14, 15, 17, 18, 19. Similarly, the various earth points are interconnected and connected to the output contacts studs numbered 4, 8, 12, 16 and to an additional contact M, by other conductors. The various contact studs 1, 2, ... 19, M follow one another in this order at the periphery of the substrate 100. There is no intersection between the various elements deposited on the substrate (resistors and connecting paths). The techniques of thin-layer implantation are known. The formation of a thin layer on a silicon substrate is somewhat special in that silicon is conductive. One of the possible techniques is the following: to form an electrical insulation, the first step is to oxidize the silicon to obtain a layer of silicon oxide approximately 2 μm thick, followed by the deposition from above of a 2.5 μm thick layer of tantalum which is also oxidized. The inert tantalum oxide will not be attached during etching operations through the successive masks. A layer of tantalum nitride approximately 500 Å thick, a layer of nichrome 500 to 1000 Å thick and a layer of gold 1.5 μm thick are then successively deposited, the layer of tantalum nitride being deposited by cathode sputtering and the other two layers being deposited by vacuum evaporation. The three layers are selectively etched through masks to obtain resistors formed by the layer of tantalum nitride and conductors and output contact studs formed by the three superposed layers. The values of the resistances are adjusted by laser by forming notches in the deposited layers. For measuring each resistance, one of the contact studs 1 to 19 is used together with test contact studs (not shown in the Figure) which are respectively connected to the common points of the three resistor forming each attenuating section.

The values of the resistances depend upon the geometry of the diffused zones and upon the thickness of the deposit. FIG. 4 illustrates an example of geometry which is suitable for resistors of low resistance value (typically from 10 to 500 ohms), for example the resistor $R_1$. It is formed by a rectangular deposited layer 63 of width 1 situated between two paths 61 and 62 which are separated by a distance h and of which one ensures connection with the output contact stud 1 whilst the other ensures connection with the resistors $R_2$ and $R_3$. If $\phi$ is the resistivity per unit area, the resistance obtained is equal to $R = \phi h/1$. A notch 64 formed by a laser beam enables the value of the resistance to be precisely adjusted in dependence upon its length.

FIG. 5 illustrates another example of geometry suitable for resistances of higher value and which allows easily carried out dimensions, for example the resistor $R_3$. The resistor $R_3$ is formed by a deposit 73 connected by two tags 77 and 78 to two paths 71 and 72 of which one ensures connection with the output contact stud 2 and the other ensures connection with the resistors $R_1$ and $R_2$. An odd number (3 in the Figure) of notches 74, 75, 76 enables the resistance to be increased by lengthening the path h followed by the current. By acting on the length of at least one of these notches, it is possible to adjust the value of the resistance.

The wafer 100 described above referring to FIG. 3 has to be associated with a conductive pattern in order to forms the external outputs of the attenuator. FIG. 6 is a plan view of the silicon wafer 100 carrying the circuit of the attenuator and of the associated pattern. This pattern is a set of finger-like conductive leads of which the inner portions extend within the periphery of the wafer and the other ends are arranged in two opposite rows forming the outputs. The various leads are denoted by the same numbers as the contact points of the wafer to which they will be bonded. The output ends of the leads corresponding to the contacts 1 to 19, i.e. to the various points of the circuit which may have to be interconnected, are oriented on the same side which will be called the side C. The lead corresponding to the contact 1, i.e. to the input at the attenuator, is divided in two to form an additional output E. Similarly, the lead corresponding to the contact 19, i.e. to the output of the attenuator, is divided in two to form the output S. The earth of the attenuator is connected to two outputs M and N. The outputs E, S, M, N are oriented on the side B of the circuit opposite the side C. Various techniques may be used for transferring the wafer onto the pattern. One of the most interesting methods so far as speed of production and low cost in large numbers are concerned is the method of automatic transfer onto film. This method consists in automatically and simultaneously carrying out the following operations for a large number of identical circuits:

cutting a perforated copper-lined film to form the patterns adapted to the wafers, forming gold contacts on the wafers, positioning the wafers relative to the perforated film and fixing them to a support with wax, simultaneously welding all the connections to the contact studs of each wafer: after the alignment of the contacts relative to the inner ends of the leads has been verified, a welding tool is lowered and directly heats the copper ends while pressing them against the gold contacts of the wafers, which forms a gold-tin eutectic. The heat given off melts the wax by which the wafers are held on the support so that they are only integral with the film, encapsulation of each circuit in resin which coats the wafer and part of the film, which forms cases, separation of the circuits by cutting the film between the cases.

FIG. 6 also shows the limits of the case 200 obtained with its two opposite sides C and B and the ends of the leads forming the outputs of each side of the case. The connections between the attenuating cells are formed by the pattern itself which is designed to form bridges 35, 79, 1113 and 1517 respectively between the outputs 3 and 5, 7 and 9, 11 and 13, 15 and 17. Since these various outputs have to remain accessible for the adjustment of attenuation, the outputs 3, 5, 7, 9, 11, 13 are widened and slotted in the longitudinal direction. Thus, the output 3 is divided into two parts which are separated by bending: the branch 30 intended to be optionally connected to the output 1, and the part 35 which forms a bridge with the output 5. Attenuation is determined by placing straps of the jumper type or by any displaceable short-circuiting means. Thus, for the first attenuating section, an operator will have to place a strap either between the outputs 1 and 30, which gives a transmission factor for this section equal to 1, or between the outputs 2 and 4 which gives a transmission factor equal to:

$$\frac{R_1}{R_3} + 1 + \sqrt{\frac{R_1}{R_3} \cdot \frac{(R_1 + 2)}{R_3}}$$

Since the output 4 is situated between the outputs 3 and 5 which are joined by the bridge 35, it has to be shorter so that its end is situated below the bridge. The outputs 2, 4, 6, 8, 10, 12, 14, 16, 18 are thus shorter than the outputs 1, 3, 5, 7, 9, 11, 13, 15, 17, 19. The former are bent back on one side or the other so that they are separate from the latter and enable short-circuiting jumpers to be moved readily into position. In addition, since there are only four outputs for the earth, although five are necessary, one of them, namely the output 16, is widened and slotted to form two branches 161 and 162 which are separated by bending. It is preferable for the pattern to be produced in such a way that the distances between two outputs or branches intended to be connected by a strap are all equal, the same applying to their width. In this way, it is possible to use straps of one and the same type. FIGS. 7 and 8 show two detailed views of certain outputs of the pattern:

Referring to FIG. 7, the outputs 2 and 4, which are bent back and separated by a distance d, may be connected by a strap 24. The outputs 3 and 5 are divided respectively into (30, 35) and (50, 35), the branch 35 forming a bridge between these two outputs for permanently connecting them. The branch 30 may be connected to the output 1 from which it is separated by the distance d. The branch 50 may be connected to the branch 70 of the output 7 from which it is also separated by the distance d. The widths of the outputs 2 and 4 and of the branches 30 and 50 are equal to e.

Referring to FIG. 8, the output 16 is divided into two branches 161 and 162 bent in two different directions. The branch 162 is bent in the same direction at the output 18 so that it may be connected thereto by a strap 1618. The branch 170 of the output 17 and the output 19, which are bent in the same direction, may be connected by a strap 1719, these two connections being mutually exclusive. The straps may be of different types. They have to be readily displaceable to enable attenuation to be rapidly adjusted and must be capable of being welded once the adjustment has been made, thus ensuring permanent contacts. In cases where it is intended to use commercially available jumpers, a standard value must be adopted for the distance d: for example d=5.6 mm. It is also possible to use specially produced straps comprising a handle or any other means enabling them to be readily gripped and intended to be removed once the adjustment has been made to be replaced by connecting means fixed by welding to the selected outputs.

In one variant of the invention, one of the earth outputs, for example the output 12, is left out and the resistors $R_8$ and $R_{10}$ are joined so that the outputs 11 and 13 are merged into a single output. In this case, the output 8 is divided into two branches, like the output 16, so that it may be connected by a strap to the outputs 6 and 10, the output 4 remaining intended to be connected to the single output 2. Production of the pattern will be carried out in such a way that the distances between the outputs or branches intended to be connected are all equal. This variant enables two outputs to be dispensed with, thus enabling space to be saved.

The described embodiment and its variant are only given by way of non-limiting example. The number of attenuating sections is determined according to requirements. According to the invention, implantation of the resistors must permit the use of a dual-in-line pattern, one row of outputs, optionally divided into several branches, enabling short circuits to be established by means of straps. In addition, the implantation plan must avoid intersections of conductors and the superposition of conductive layers on the substrate.

FIG. 9 shows the mode of implantation of the attenuator on a printed board 201 containing the circuit into which the attenuator is inserted. The attenuator 200 is disposed on the slice. Its outputs E, M, N, S, facing the printed board 201, side B, are connected to the external circuit. The outputs 1 to 19, side C, are thus readily accessible to the operator responsible for adjustment. In addition, this arrangement reduces clutter on the printed board.

In one embodiment of the invention, the values of resistances were selected in such a way that the successive attenuating sections had the following respective attenuations: $A_1=0.5$ dB, $A_2=1$ dB, $A_3=2$ dB, $A_4=4$ dB, $A_5=8$ dB, the input and output impedances being equal to 600 ohms.

The following Table shows the attenuation values obtained in dependence upon the contacts established between the various output branches. The symbol X indicates that the contact is established.

| 1-30 | 50-70 | 90-110 | 130-150 | 170-19 | 2-4 | 6-8 | 10-12 | 14-161 | 162-18 | A (dB) |
|---|---|---|---|---|---|---|---|---|---|---|
| X | X | X | X | X | | | | | | 0 |
| | X | X | X | X | X | | | | | 0.5 |
| X | | X | X | X | | X | | | | 1 |
| | | X | X | X | X | X | | | | 1.5 |
| X | X | | X | X | | | X | | | 2 |
| | X | | X | X | X | | X | | | 2.5 |
| X | | | X | X | | X | X | | | 3 |
| | | | | X | X | X | X | | | 3.5 |
| X | X | X | | X | | | | X | | 4 |
| | X | X | | X | | | | X | | 4.5 |
| X | | X | | X | | X | | X | | 5 |
| | | X | | X | X | X | | X | | 5.5 |
| X | X | | | X | | | X | X | | 6 |
| | X | | | X | X | | X | X | | 6.5 |
| X | | | | X | | X | X | X | | 7 |
| | | | | X | X | X | X | X | | 7.5 |

-continued

| 1-30 | 50-70 | 90-110 | 130-150 | 170-19 | 2-4 | 6-8 | 10-12 | 14-161 | 162-18 | A (dB) |
|---|---|---|---|---|---|---|---|---|---|---|
| X | X | X | X |   |   |   |   |   | X | 8 |
|   | X | X | X | X |   |   |   |   | X | 8.5 |
| X |   | X | X |   | X |   |   |   | X | 9 |
|   |   |   | X | X | X | X |   |   | X | 9.5 |
| X | X |   | X |   |   |   | X |   | X | 10 |
|   | X |   | X | X |   | X |   |   | X | 10.5 |
| X |   |   | X |   |   | X | X |   | X | 11 |
|   |   |   | X |   | X | X | X |   | X | 11.5 |
| X | X | X |   |   |   |   |   | X | X | 12 |
|   | X | X |   | X |   |   |   | X | X | 12.5 |
| X |   | X |   |   | X |   |   | X | X | 13 |
|   |   | X |   |   | X | X |   | X | X | 13.5 |
| X | X |   |   |   |   |   | X | X | X | 14 |
|   | X |   |   | X |   | X | X | X | X | 14.5 |
| X |   |   |   |   | X | X | X | X | X | 15 |
|   |   |   |   |   | X | X | X | X | X | 15.5 |

A set of component values is as follows:

$R_1 = R_2 = 17.26$ ohms     $R_3 = 10.417$ k ohms
$R_4 = R_5 = 34.5$ ohms      $R_6 = 5.002$ k ohms
$R_7 = R_8 = 68.77$ ohms     $R_9 = 2.583$ k ohms
$R_{10} = R_{11} = 135.8$ ohms   $R_{12} = 1.258$ k ohms
$R_{13} = R_{14} = 258.3$ ohms   $R_{15} = 567.7$ ohms According to the position of the short-circuiting jumpers shown in FIG. 9: 31, 57, 1012, 1315, 1618, the attenuation is $A = 0 + 0 + 2 + 0 + 8 = 10$ dB.

The characteristic dimensions of this attenuator for the case illustrated in FIG. 9 are: $L_1 = 46$ mm, $L_2 = 15$ mm and $L_3 = 2$ mm, the dimensions of the wafer being 3 mm × 3 mm. The width of the outputs or output branches is $e = 0.4$ mm and the distance d is $d = 5.6$ mm.

What we claim is:

1. A step adjustable attenuator intended to be inserted in surrounding circuits and comprising an integrated circuit formed by a plurality of attenuating sections, said attenuator comprising an insulative substrate, a thin film-network deposited on said substrate and forming said integrated circuit, some of the connections in said integrated circuit being omitted, contact points disposed on the periphery of said substrate and thin-film electrical conductors connecting said network to said contact points; said attenuator further comprising a conductive pattern forming a set of leads having one end respectively bonded to said contact points and other ends arranged in first and second rows of outputs, said first row being provided for connections with said surrounding circuits, said second row comprising a first set of outputs interconnected in twos providing those connections in said integrated circuit omitted in said network and a second set of outputs; said attenuator further comprising displaceable connecting means adaptable to said second set of outputs.

2. An attenuator as claimed in claim 1, further comprising a case covering said substrate and a part of said pattern and leaving free the ends of said pattern which form the outputs.

3. An attenuator as claimed in claim 1, wherein said substrate comprises a silicon support and a layer of silicon oxide covering said support.

4. An attenuator as claimed in any of claim 1, wherein said sections comprise adjustable deposited resistors.

5. An attenuator as claimed in claim 4, wherein said resistors are connected to one another and to said contact points by deposited metallic paths; said resistors and said paths being in the form of thin layers; said resistors and said paths being obtained by successive maskings.

6. An attenuator as claimed in claim 5, wherein said omitted connections are those interconnecting said attenuating sections.

7. An attenuator as claimed in claim 6, wherein each section has two possible modes of connection supplying two attenuation values.

8. An attenuator as claimed in claim 7, wherein each mode of connection is selected by placing said connecting means on one of two possible pairs of outputs.

9. An attenuator as claimed in claim 8, wherein said sections have common outputs, said common outputs being divided into two branches separated from on another by bending.

10. An attenuator as claimed in claim 9, wherein two outputs belonging to the same pair are separated by one output belonging to another pair, two adjacent pairs being separated from one another by bending.

11. An attenuator as claimed in claim 1, wherein said connecting means are formed by displaceable jumpers adapted to be fixed to said outputs after adjustment.

* * * * *